United States Patent
Schuetz

(10) Patent No.: US 9,117,685 B2
(45) Date of Patent: Aug. 25, 2015

(54) RECONFIGURING THROUGH SILICON VIAS IN STACKED MULTI-DIE PACKAGES

(71) Applicant: Conversant Intellectual Property Management Inc., Ottawa (CA)

(72) Inventor: Roland Schuetz, Ottawa (CA)

(73) Assignee: Conversant Intellectual Property Management Inc., Ottawa (CA)

( * ) Notice: Subject to any disclaimer, the term of this patent is extended or adjusted under 35 U.S.C. 154(b) by 0 days.

(21) Appl. No.: 14/101,507

(22) Filed: Dec. 10, 2013

(65) Prior Publication Data

US 2014/0097891 A1    Apr. 10, 2014

Related U.S. Application Data

(62) Division of application No. 12/773,340, filed on May 4, 2010, now Pat. No. 8,604,593.

(60) Provisional application No. 61/252,865, filed on Oct. 19, 2009.

(51) Int. Cl.
| | |
|---|---|
| *H01L 25/00* | (2006.01) |
| *H01L 25/065* | (2006.01) |
| *G11C 29/00* | (2006.01) |
| *H01L 23/48* | (2006.01) |
| *H01L 25/18* | (2006.01) |

(52) U.S. Cl.
CPC .......... *H01L 25/0657* (2013.01); *G11C 29/808* (2013.01); *H01L 23/481* (2013.01); *H01L 25/18* (2013.01); *H01L 2225/06513* (2013.01); *H01L 2225/06527* (2013.01); *H01L 2225/06541* (2013.01); *H01L 2924/0002* (2013.01)

(58) Field of Classification Search
CPC ................... H01L 2225/06548; G11C 29/808; G11C 29/86; G11C 29/816
USPC ........... 327/565, 564; 361/790, 735; 257/621, 257/E23.174, E25.013
See application file for complete search history.

(56) References Cited

U.S. PATENT DOCUMENTS

| | | | | |
|---|---|---|---|---|
| 2007/0024319 A1* | 2/2007 | Bangert et al. | ................... | 326/39 |
| 2010/0060310 A1* | 3/2010 | Laisne et al. | ................... | 326/10 |

FOREIGN PATENT DOCUMENTS

| | | |
|---|---|---|
| TW | 200826175 | 6/2008 |
| TW | 200933839 | 8/2009 |
| WO | 2009/079772 | 7/2009 |

* cited by examiner

*Primary Examiner* — Caridad Everhart
(74) *Attorney, Agent, or Firm* — Daniel Hammond

(57) ABSTRACT

Through silicon vias (TSVs) in a stacked multi-die integrated circuit package are controlled to assume different connection configurations as desired during field operation of the package in its normal mission mode. TSV connections may be reconfigured to connect an affected die in a manner different from, for example, a factory default connection of that die. TSV connections to the inputs and/or outputs of a die's native circuitry may be changed. A die may be disconnected altogether from an interface that interconnects dice in the stack, or a die that was originally disconnected from such an interface may be connected to the interface.

4 Claims, 5 Drawing Sheets

RECONFIGURING THROUGH SILICON VIAS IN STACKED MULTI-DIE PACKAGES

This application is a divisional of U.S. patent application Ser. No. 12/773,340, filed on May 4, 2010, which claims priority under 35 USC 119 to U.S. Provisional Application No. 61/252,865, which was filed on Oct. 19, 2009 all of which are incorporated herein by reference.

FIELD

The present work relates to semiconductor integrated circuit devices and, more particularly, to packaged arrangements of multiple integrated circuit dice in a stacked configuration, interconnected by through silicon vias (TSVs).

BACKGROUND

Conventional technology provides for stacked multi-die packages with adjacent dice interconnected by TSVs. A number of spare TSVs may be provided on each die for redundancy purposes, thereby permitting replacement of any faulty TSVs that may be identified during manufacturing. After the initial manufacturing process has been completed, the spare TSVs on the die are not used.

It is therefore desirable to provide for utilizing spare TSVs in stacked multi-die packages.

SUMMARY

It is therefore an object of the invention to provide apparatus, methods, and systems for utilizing spare TSVs in stacked multi-die packages.

According to a broad aspect of the invention there is provided an integrated circuit die apparatus, including a plurality of vias extending through the apparatus for providing external access to signals on the apparatus; and a router coupled to said vias, said router configured to cause said vias to assume a selected one of a plurality of signal-carrying configurations; wherein, in said selected signal-carrying configuration, at least one of said vias carries an associated at least one signal that said at least one via does not carry in another of said signal-carrying configurations.

Preferably, at least another of said vias carries the associated at least one signal in said another of said signal-carrying configurations.

Beneficially, the apparatus includes a controller coupled to said router for providing thereto a control signal indicative of said selected signal-carrying configuration.

Additionally, said controller is configured to receive information indicative of said selected signal-carrying configuration, and to provide said control signal in response to said information.

Conveniently, said controller is coupled to a group of said vias to receive said information from a source external to the apparatus via said group of vias.

Preferably, said router is configured to route said information from said group of vias to said controller.

Conveniently, the external source is a further integrated circuit die apparatus having a further plurality of vias extending therethrough for providing external access to signals on the further apparatus.

Additionally, said group of vias is adapted for connection to a further group of the further plurality of vias to receive said information.

Beneficially, said controller is adapted to receive said information from an external controller that selects said selected signal-carrying configuration.

Gainfully, said controller includes a register for storing said control signal.

Additionally, a group of said vias is coupled to said controller to transfer, from said controller to a further controller of a further integrated circuit die apparatus, information indicative of a selected one of a plurality of signal-carrying configurations assumable by a further plurality of vias that extend through the further apparatus and provide external access to signals on the further apparatus.

Preferably, the apparatus includes native circuitry coupled to said router and wherein, in respective ones of said signal-carrying configurations, said router routes respective signals from respective portions of said native circuitry to a same one of said vias.

According to another broad aspect of the invention there is provided a method of integrated circuit die operation, including causing a plurality of vias that extend through the die and provide external access to signals on the die to assume a first signal-carrying configuration; and causing the plurality of vias to assume a second signal-carrying configuration; wherein, in the first signal-carrying configuration, at least one of the vias carries an associated at least one signal that the at least one via does not carry in the second signal-carrying configuration.

Preferably, the first and second signal-carrying configurations respectively route signals from respective portions of native circuitry on the die to a same one of the vias.

According to still another broad aspect of the invention there is provided a stacked integrated circuit apparatus, including a plurality of integrated circuit die apparatus, each said integrated circuit die apparatus including a plurality of vias extending therethrough for providing external access to signals on the integrated circuit die apparatus, said plurality of integrated circuit die apparatus arranged in a stack such that the vias of each said integrated circuit die apparatus are respectively connected to the vias of an adjacent integrated circuit die apparatus; and each said integrated circuit die apparatus including a router coupled to the associated vias and configured to cause the associated vias to assume a signaling connection configuration in which native circuitry of the associated integrated circuit die apparatus is connected by selected ones of the associated vias for signaling with an adjacent said integrated circuit die apparatus, each said router further configured to cause the associated vias to assume a signaling disconnect configuration in which the native circuitry of the associated integrated circuit die apparatus is not connected for signaling with the adjacent integrated circuit die apparatus.

Preferably, the apparatus includes a packaging substrate coupled to one said integrated circuit die apparatus.

According to yet another broad aspect of the invention there is provided a stacked integrated circuit apparatus, including a plurality of integrated circuit die apparatus; each said integrated circuit die apparatus including a plurality of vias extending therethrough for providing external access to signals on the integrated circuit die apparatus, said plurality of integrated circuit die apparatus arranged in a stack such that the vias of each said integrated circuit die apparatus are respectively connected to the vias of an adjacent integrated circuit die apparatus, each said integrated circuit die apparatus including a router coupled to the associated vias and configured to cause the associated vias to assume a selected one of a plurality of signal-carrying configurations wherein, in said selected signal-carrying configuration, at least one of the associated vias carries an associated at least one signal that said at least one via does not carry in another of said signal-carrying configurations.

Preferably, the apparatus includes a packaging substrate coupled to one said integrated circuit die apparatus.

According to another broad aspect of the invention there is provided a method of operating a plurality of stacked integrated circuit die apparatus wherein each integrated circuit die apparatus includes a plurality of vias extending therethrough for providing external access to signals on the integrated circuit die apparatus, and in which the vias of each said integrated circuit die apparatus are respectively connected to the vias of an adjacent integrated circuit die apparatus, the method including: causing the vias of one integrated circuit die apparatus to assume a signaling connection configuration in which native circuitry of the one integrated circuit die apparatus is connected by selected ones of the vias for signaling with an adjacent said integrated circuit die apparatus; and causing the vias of the one integrated circuit die apparatus to assume a signaling disconnect configuration in which the native circuitry of the one integrated circuit die apparatus is not connected for signaling with the adjacent integrated circuit die apparatus.

Beneficially, said first-mentioned causing results in connection of one said integrated circuit die apparatus into an interface that interconnects at least some of the remaining said integrated circuit die apparatus and from which said one integrated circuit die apparatus was disconnected before said first-mentioned causing.

Conveniently, said second-mentioned causing results in disconnection of one of said at least some of the remaining integrated circuit die apparatus from said interface.

Preferably, said last-mentioned causing results in disconnection of one said integrated circuit die apparatus from an interface that interconnects at least some of the remaining said integrated circuit die apparatus.

According to another broad aspect of the invention there is provided a system, including a stacked integrated circuit apparatus, including a plurality of integrated circuit die apparatus, each said integrated circuit die apparatus including a plurality of vias extending therethrough for providing external access to signals on the integrated circuit die apparatus, said plurality of integrated circuit die apparatus arranged in a stack such that the vias of each said integrated circuit die apparatus are respectively connected to the vias of an adjacent integrated circuit die apparatus, each said integrated circuit die apparatus including a router coupled to the associated vias and configured to cause the associated vias to assume a selected one of a plurality of signal-carrying configurations wherein, in said selected signal-carrying configuration, at least one of the associated vias carries an associated at least one signal that said at least one via does not carry in another of said signal-carrying configurations; and electronic circuitry provided externally of said stacked integrated circuit apparatus and coupled thereto for communication therewith.

Preferably, said stacked integrated circuit apparatus implements one of data processing functionality and data storage functionality, and said electronic circuitry is cooperable with said one of data processing functionality and data storage functionality.

According to yet another aspect of the invention there is provided a system, including a stacked integrated circuit apparatus, including a plurality of integrated circuit die apparatus, each said integrated circuit die apparatus including a plurality of vias extending therethrough for providing external access to signals on the integrated circuit die apparatus, said plurality of integrated circuit die apparatus arranged in a stack such that the vias of each said integrated circuit die apparatus are respectively connected to the vias of an adjacent integrated circuit die apparatus, each said integrated circuit die apparatus including a router coupled to the associated vias and configured to cause the associated vias to assume a signaling connection configuration in which native circuitry of the associated integrated circuit die apparatus is connected by selected ones of the associated vias for signaling with an adjacent said integrated circuit die apparatus, each said router further configured to cause the associated vias to assume a signaling disconnect configuration in which the native circuitry of the associated integrated circuit die apparatus is not connected for signaling with the adjacent integrated circuit die apparatus; and electronic circuitry provided externally of said stacked integrated circuit apparatus and coupled thereto for communication therewith.

Beneficially, said stacked integrated circuit apparatus implements one of data processing functionality and data storage functionality, and said electronic circuitry is cooperable with said one of data processing functionality and data storage functionality.

It should be noted that for the purpose of this disclosure a router includes a switch, a multiplexer, or any other means known in the art for selectively connecting any one of a plurality of inputs to an output port.

BRIEF DESCRIPTION OF THE DRAWINGS

FIGS. 7a-8b diagrammatically illustrate examples of reconfigurations of die-level connections in a stacked multi-die package apparatus according to example embodiments of the present work.

DETAILED DESCRIPTION

Example embodiments of the present work provide for causing TSVs in a stacked multi-die package to assume different connection configurations as desired using a router that may be controlled by a programmable register. In various embodiments, connections among the dice or between a die and a substrate are reconfigured. By changing the value stored in the register, a user may, during field operation of the package in its normal mission mode, connect the affected die in a manner different from, for example, a factory default connection. As examples, TSV connections to the I/O (inputs and/or outputs) of a die's native circuitry may be changed, a die may be disconnected altogether from the stack, or a die that was originally disconnected from the stack in the factory default configuration may be connected.

Figure 1:
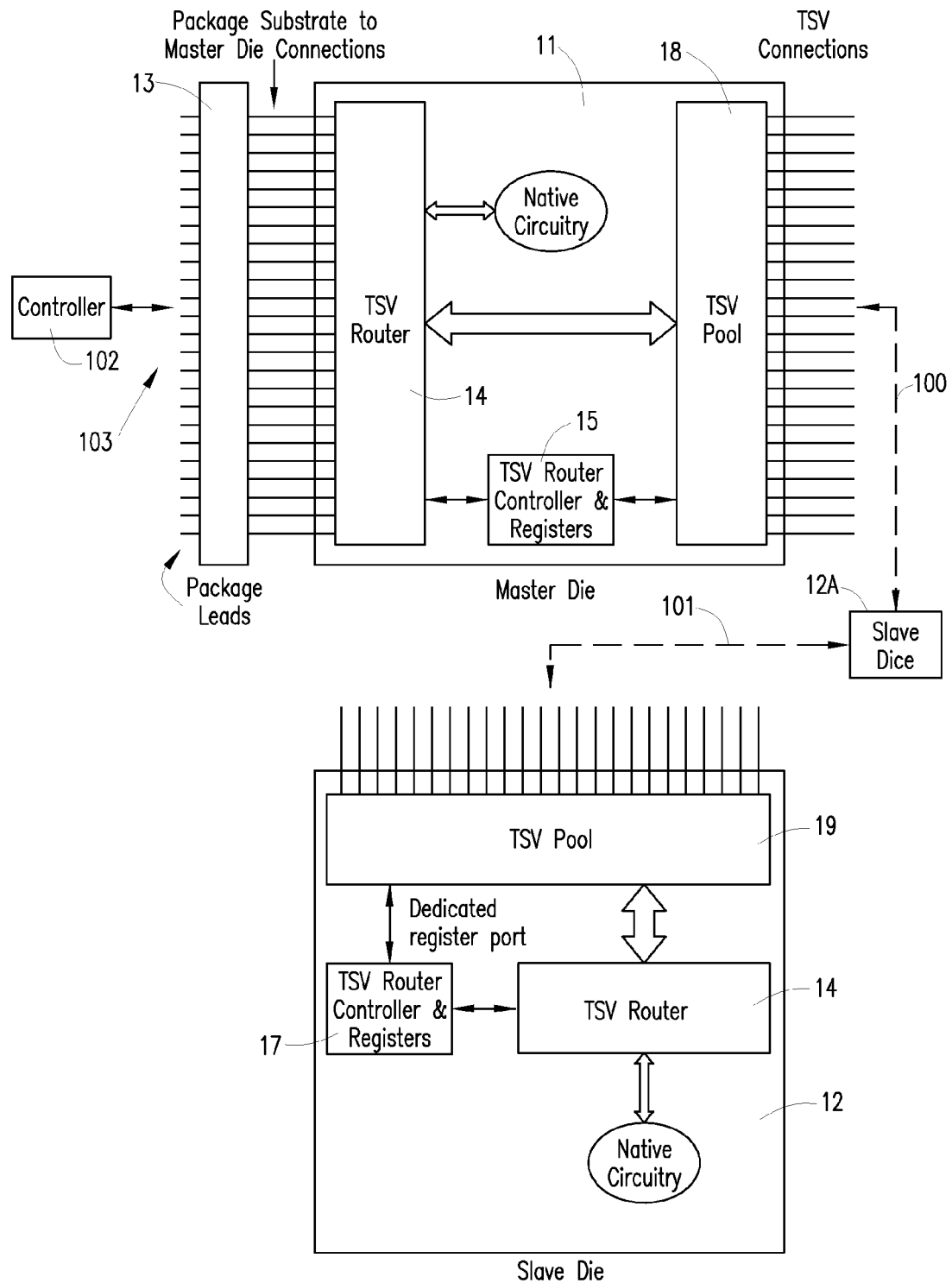
FIG. 1 diagrammatically illustrates a stacked multi-die package apparatus according to example embodiments of the present work.

FIG. 1 diagrammatically illustrates a multi-chip package containing stacked integrated circuit dice according to example embodiments of the present work. A master die 11 is connected to the package's external terminals (e.g., package leads). One or more slave dice may be stacked atop the master die 11. (Although the physical stack is not explicitly shown in the diagrammatic representation of FIG. 1, it will be understood by workers in the art.) FIG. 1 shows explicitly a slave die 12 which would be positioned in the stack physically opposite the master die 11. Intervening stacked slave dice 12 are designated collectively at 12A. The broken line 100 represents connections between TSVs of the master die 11 and respective axially aligned TSVs of the slave die adjacent master die 11. The broken line 101 represents connections between TSVs of the slave die 12 and respective axially aligned TSVs of the slave die adjacent slave die 12. TSV connections between adjacent ones of the intervening stacked slave dice at 12A are not explicitly shown. It is known in the art to package a stack of integrated circuit dice with respective axially aligned TSVs of each pair of adjacent dice electrically connected to one another.

Typically, a number of TSVs are fabricated on each die and extend through the die for connecting to TSVs of adjacent die on respectively opposite sides of the die. A subset of the TSVs is selected by design for connecting signals and/or power between the dice in a stack. Example embodiments of the present work take advantage of the remaining (spare) TSVs that were neither allocated for use in the chip design nor used to replace faulty TSVs. These spare TSVs are made available for establishing different connection configurations at a future time.

Master die 11 in FIG. 1 is connected to the external terminals of the packaged multi-die stack via a package substrate 13 (a printed circuit board in some embodiments). Master die 11 includes TSVs 18, a TSV router 14, a TSV router controller 15, and native circuitry that implements the normal functionality of the master die 11. The slave die 12 includes TSVs 19, a TSV router 14, a TSV router controller 17, and its own native circuitry.

Figure 2:
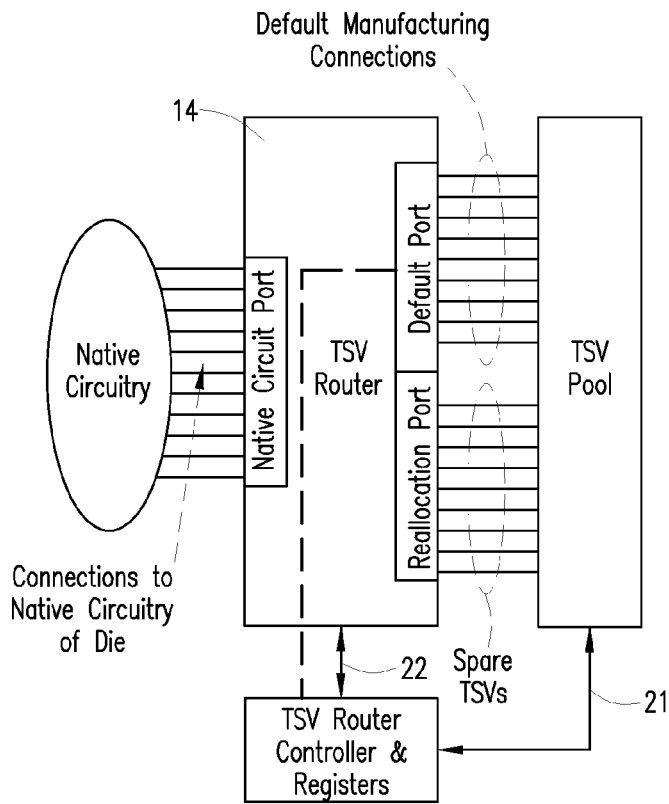
FIG. 2 diagrammatically illustrates a TSV router of FIG. 1 in more detail according to example embodiments of the present work.

FIG. 2 diagrammatically illustrates the TSV router 14 in more detail according to exemplary embodiments of the present work. The router 14 includes a default port connected to those TSVs of the die that have been assigned by the chip design to carry the signals and power required for the intended operation of the stacked multi-die package. These TSVs are also referred to herein as default TSVs. The design may also allocate default TSVs to transfer signals and/or power through the die for use by adjacent dice on opposite sides of the die. The router 14 further includes a native circuitry port for interfacing with the native circuitry of the die. In the initial default configuration of the die as originally manufactured, the router 14 implements appropriate connections between the default port and the native circuitry port to connect default TSVs to the native circuitry as desired.

It should be noted that for the purpose of this disclosure a router includes a switch, a multiplexer, or any other means known in the art for selectively connecting any one of a plurality of inputs to an output port.

Heretofore, the remaining spare TSVs have not been used except during the initial manufacturing process, when they are available for redundancy purposes to replace faulty TSVs identified during the manufacturing process. According to the present work, the router 14 includes a reallocation port connected to the spare TSVs. These spare TSVs are thus available for use in reconfiguring connections, and/or configuring new connections, within the stacked multi-die package during field operation of the package in its normal mission mode.

FIG. 2 also illustrates that, in various embodiments, the router controller (see also 15 and 17 in FIG. 1) may be connected to default TSVs of the associated die via the router 14 (see broken lines), or by a dedicated connection 21. Programmable registers in the controller may be accessed via TSVs and used to control router 14, via a control connection at 22, to allocate spare TSVs for reconnecting or disconnecting signals that are already otherwise connected, or for making new connections that did not previously exist.

Figure 3:
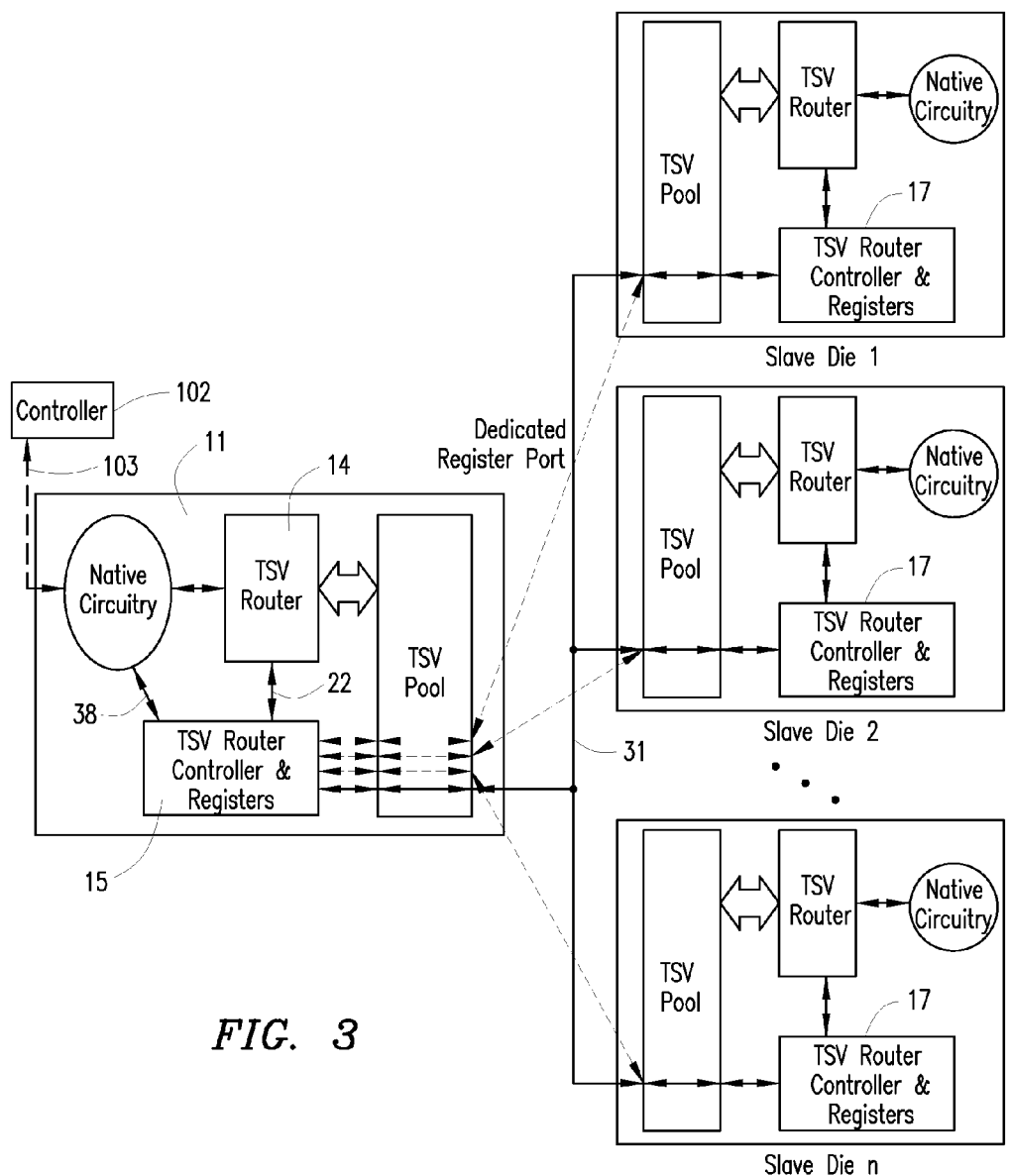
FIG. 3 diagrammatically illustrates communication links between TSV router controllers within dice of a stacked multi-die package apparatus according to example embodiments of the present work.

FIG. 3 shows a master die 11 and several slave dice 12 (also designated as slave dice 1-n) whose router controllers are interconnected via a dedicated link that includes TSVs of the interconnected dice. In some embodiments, the dedicated link may be of the form of respective separate connections from the master controller 15 to each slave controller 17. This is indicated by the broken line connections in FIG. 3. In some embodiments, a single parallel link connects the master controller to all slave controllers on a shared bus 31. In the broken line embodiments with separate controller interconnections, the master controller 15 has a number of separate ports, one for each slave controller 17. Accordingly, these embodiments accommodate only that number of slave dice. On the other hand, the shared bus embodiments accommodate as many slave dice as there are addresses to identify slave dice. Thus, the number of slave dice that may be supported depends only on the width of the device address field supported by the shared bus 31.

Some embodiments reallocate TSVs of a die by programming one or more registers of the associated router controller with specific values that correspond to breaking existing connections and/or making new connections. Generally, the user programs the connection values into the registers of the router controller of a die (e.g., the master) in the stack which, in turn, affects the corresponding registers in the other dice in the stack. In this way, the TSV connection configurations among all dice in the stack may be coordinated.

Referring again to FIG. 3, in some embodiments, the user employs a designated command to reprogram the appropriate router controller register(s) on the master die 11, which is connected to the external package leads at 103 to receive the user command from an external controller 102 (see also FIG. 1). In some embodiments, the connection at 103 is made via TSVs of the master die 11, the package substrate and the external package terminals. On the master die, the native circuitry has a port 38 to the router controller 15, and is used for read/write access to the registers therein. In some embodiments, the TSV controller 15 uses the TSV router controller link (e.g., shared bus 31) to copy its newly written register values (or corresponding values needed for the desired TSV configuration) to the router controller registers of any slave die (or dice) involved in the desired reconfiguration of TSV connections. The router controller 15 of the master die 11 determines, from information contained in the command, the appropriate values that should be written to its registers and those of the affected slave dice controllers 17 to realize the desired TSV configuration for the stack.

Figure 4:
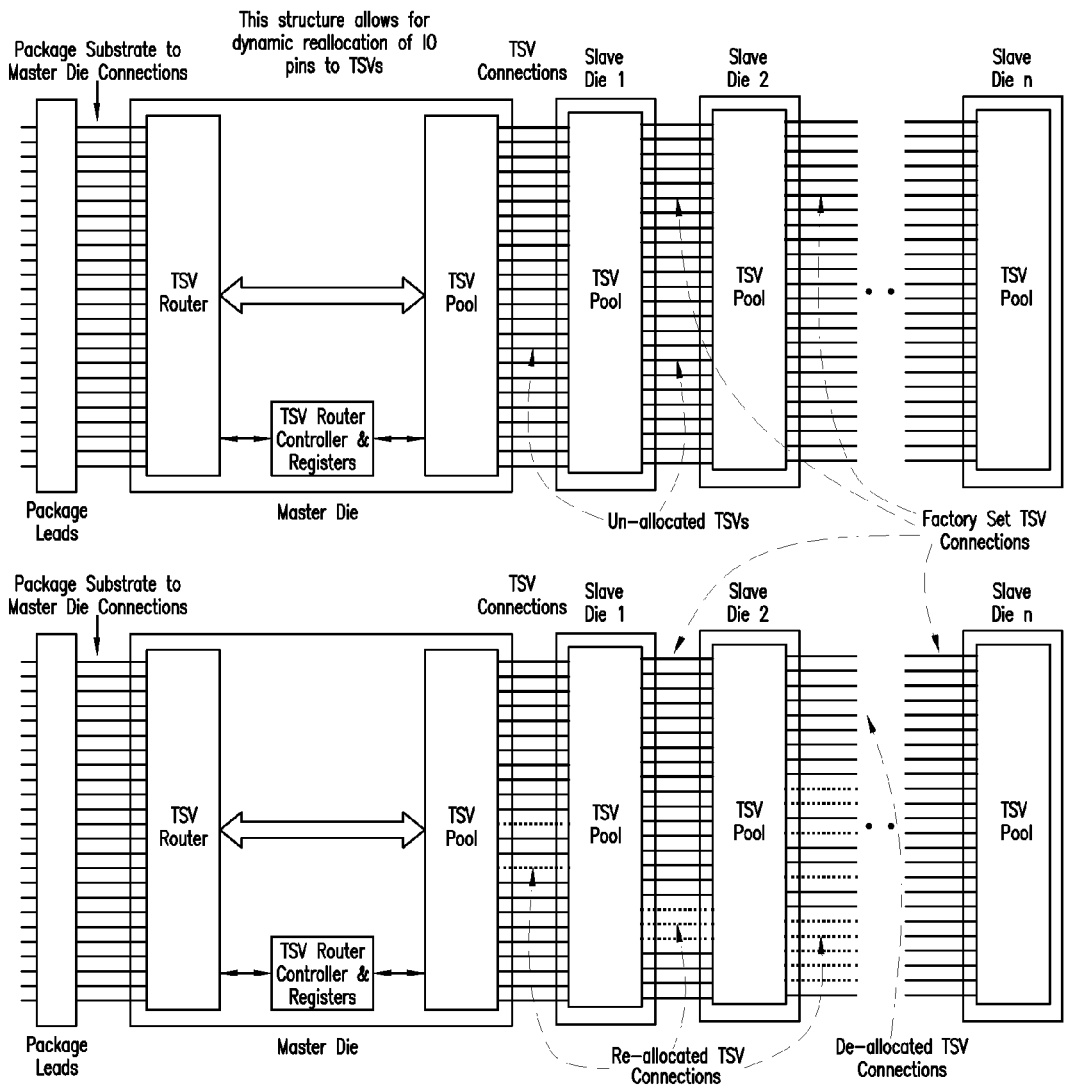
FIG. 4 diagrammatically illustrates examples of TSV reallocations supported by a stacked multi-die package apparatus according to example embodiments of the present work.

FIG. 4 shows reconfiguration of existing connections according to example embodiments of the present work. The top part of FIG. 4 shows a stack of dice having a subset (shown by darkened in-service TSV lines in FIG. 4) of the total available TSVs in service at the time of manufacturing.

Figure 5A:
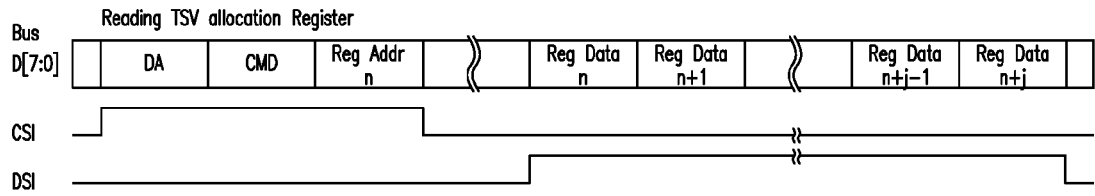
FIGS. 5a and 5b are timing diagrams of signaling operations respectively associated with reading and writing registers in TSV router controllers of a stacked multi-die package apparatus according to example embodiments of the present work.
Figure 5B:
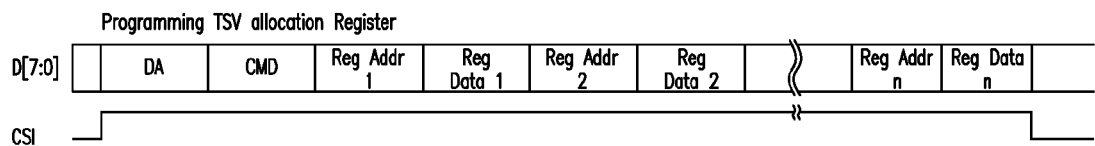

At some time during use in mission mode, spare TSV connections of the die stack may be reconfigured to use TSVs other than the original in-service TSVs (as shown by the different darkened in-service TSV lines) in the bottom part of FIG. 4. In general, a command is issued to program registers of one or more of the router controllers, which then causes the associated TSV router(s) to reassign the associated connections. This is done in some embodiments with a unique command such as depicted in FIG. 5. The command has the requisite device address (DA) and command information (CMD). In some embodiments, registers may be read as described below relative to FIG. 5a, or written as described below relative to FIG. 5b. For register write (programming) operations, some embodiments supply the register address and its corresponding write data in pairs. By supplying the target register address as well as the data, the controller does not have to issue the correct data for all fields in the register group as is required for other writable register types. Thus, the controller avoids overhead such as maintaining a map of all existing register values, or first reading the register values for subsequent reprogramming.

FIG. 5a shows a command that is used to read the TSV allocation registers according to example embodiments of the present work. In some embodiments, the command packet follows a conventional protocol. Specifically, with CSI (command strobe input) high, the device address, followed by the command byte, and register address byte[s] are driven onto the bus (e.g., shared bus 31 of FIG. 3), thereby priming the target device to read the TSV allocation registers beginning with the register at the address given in the command packet.

After a predetermined time (often referred to as $t_{CDS}$ in typical device data sheets) elapses, the controller asserts DSI (data strobe input) which signals the target device to drive the bus with current register data, beginning at the address specified in the command packet. The target device internally increments its address pointer and drives out data from successive register addresses for as long as DSI is high or until the end of the register address space is reached. This constitutes the die's response to the command, shown by the bus activity after DSI assertion.

FIG. 5b shows a command packet that is used to change the allocation of TSVs in a multi-chip package according to example embodiments of the present work. In some embodiments, the command packet generally follows the conventional protocol illustrated by FIG. 5a, and contains a device address, followed by a command byte, followed by address/data byte-pairs. Register addresses and corresponding data are provided in pairs, and may each be one byte or more in length in various embodiments. These details depend on the device design parameters and would be specified in the device data sheets. For example, devices with more TSVs may require address and data fields that are longer in byte count than devices that utilize fewer TSVs. Each address field refers to a unique register in the collection of allocation registers which contains information about the allocation of signals to TSVs. The data provided in the command packet data field over-writes the data in the specified allocation register and, thereby, implements a new TSV/signal allocation.

Figure 6:
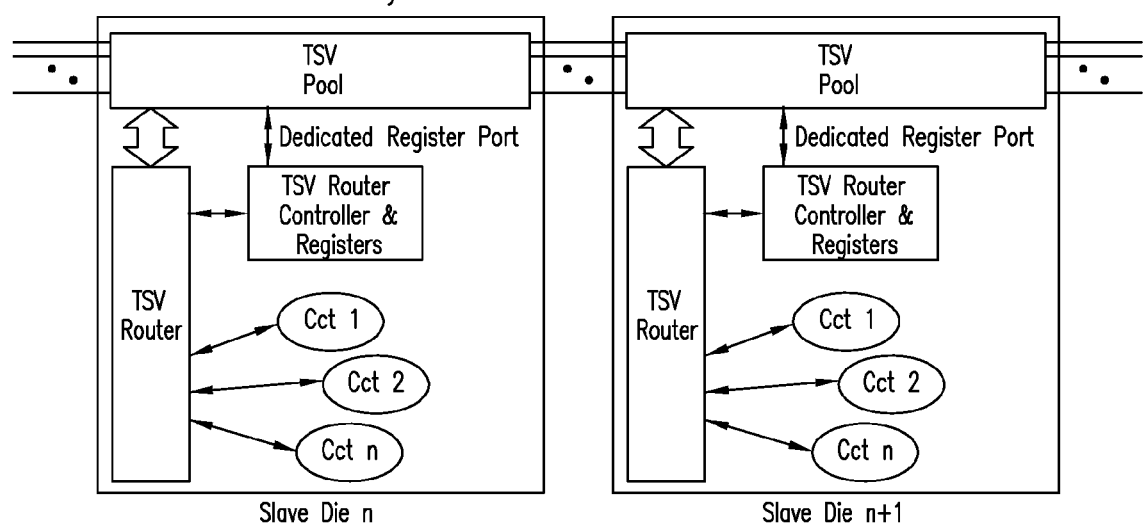
FIG. 6 diagrammatically illustrates in more detail slave dice within a stacked multi-die package apparatus according to example embodiments of the present work.

Example embodiments for connecting previously unconnected native die circuitry are illustrated diagrammatically in FIG. 6. TSVs may be used to connect into the stack package sub-circuits (designated generally as Cct1-Cctn) that were not connected in the default manufacturing configuration, or to disconnect from the stack package selected sub-circuits that were connected in the default manufacturing configuration.

Figures 7A, 7B, 7C:
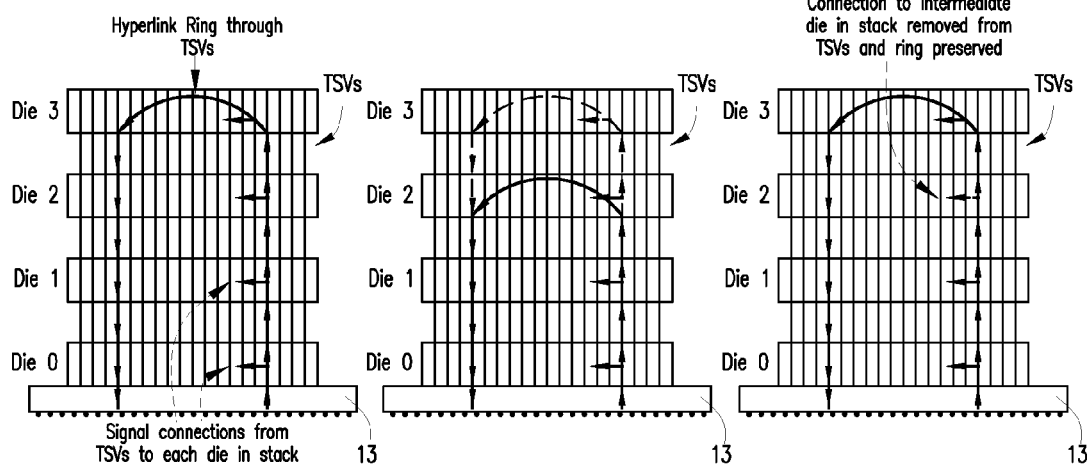

FIG. 7 diagrammatically illustrates adding/removing a die from a stack, or adding/removing a die from a ring architecture according to example embodiments of the present work. As an example, a stacked memory package may have one of its dice removed from the memory interface or ring architecture, or it may contain "spare" dice that can be added to the interface/ring at a future time. Die 0 in FIG. 7 may be a master die 11, with the remaining dice (Die 1-Die 3) being slave dice 12. FIG. 7 shows situations wherein a top (FIG. 7b) or intermediate (FIG. 7c) die is removed from the interface/ring configuration of FIG. 7a. In some embodiments, the user operates external controller 102 (see also FIGS. 1 and 3) to issue a suitable command that causes the TSV router of the affected die to change the die's current TSV configuration by disconnecting from the native circuitry of the die selected ones of the die's TSVs that are connected to the native circuitry in the current configuration. In some embodiments, the external controller 102 issues the command automatically in response to the OS (operating system) or controller microcode detecting a predetermined condition in the package.

Figures 8A, 8B:
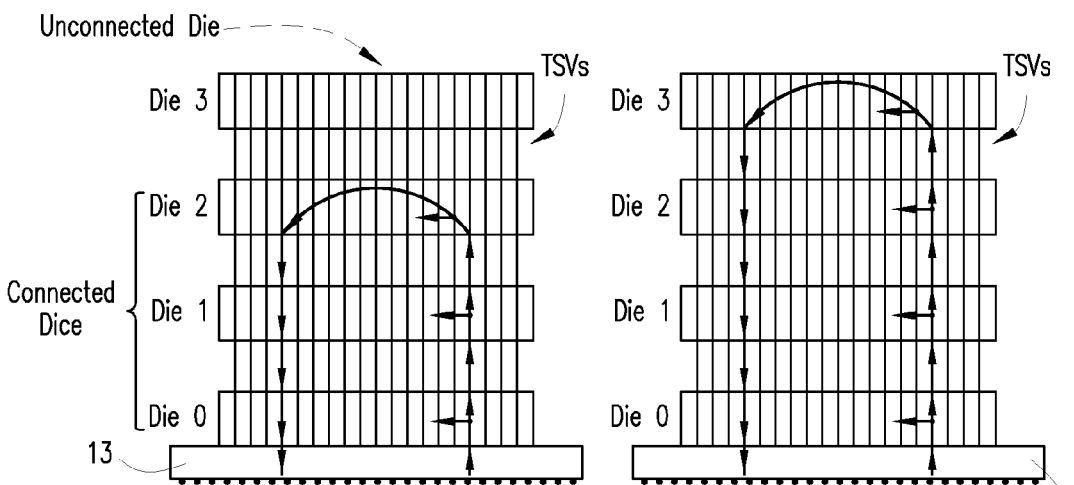

FIG. 8a shows a device stack according to example embodiments of the present work that contains a "spare" die (die 3) which may be selectively connected either by the user or by automatic software/hardware control. An example application is in a multi-chip package flash memory device that contains one or more spare flash dice. If more memory capacity is required, a spare die may be added into the interface/ring as shown in FIG. 8b. As another example, when one die in FIG. 8a fails, it may be removed and replaced with a spare die, thereby ultimately arriving at the configuration shown in FIG. 7c, and extending the useful life of the multi-chip package. In various embodiments, the die replacement process may be triggered by an error reaching some threshold on a particular die, by failure of a predetermined number of sub-circuits in the native circuitry on the die, or by failure of a specific sub-circuit. When the condition is detected, a suitable command (or commands) cause the TSV router controllers of the spare die and the failed die to participate in execution of a suitable remedial procedure, for example: (1) connect the spare die into the interface/ring; (2) transfer data from the failed die to the spare die; and (3) disconnect the failed die from the interface/ring.

Figure 9:
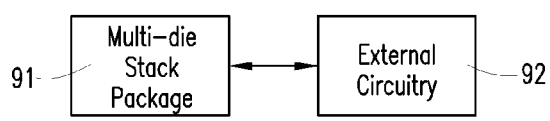
FIG. 9 diagrammatically illustrates a system including a stacked multi-die package apparatus according to example embodiments of the present work.

FIG. 9 diagrammatically illustrates a system according to example embodiments of the present work. A multi-die stack package 91, for example a package such as described above relative of FIGS. 1-8b, is coupled for communication with external electronic circuitry 92. In some embodiments, the package 91 implements data storage functionality, for example, flash memory functionality. In some embodiments, the package 91 implements any desired application specific functionality, for example, digital data processing. In various embodiments, the electronic circuitry 92 may be any collection of circuitry that utilizes and/or controls the functionality implemented by the package 91, for example, a memory controller cooperable with data storage functionality implemented by the package 91, and may implement the functionality of controller 102 as described above with respect to FIGS. 1-8.

Although example embodiments have been described above in detail, this does not limit the scope of the invention, which can be practiced in a variety of embodiments.

What is claimed is:

1. A method of operating a plurality of stacked integrated circuit dice, the dice being serially connected in a ring topology, each die including a plurality of vias extending therethrough for providing external access to signals on the die, the vias of each die being connected to the vias of an adjacent die, the method comprising:

causing the vias of at least one die to assume a signaling connection configuration in which native circuitry of the at least one die is connected by selected ones of the vias for signaling with an adjacent die; and causing the vias of the at least one die to assume a signaling disconnect configuration in which the native circuitry of the at least one die is not connected for signaling with the adjacent die.

2. The method of claim 1, wherein the signaling disconnect configuration comprises disconnection of the at least one die from an interface that interconnects at least some of the remaining dice.

3. The method of claim 1, wherein the signaling connection configuration comprises connection of the at least one die into an interface that interconnects at least some of the remaining dice and from which said at least one die was disconnected in a previous configuration.

4. The method of claim 3, wherein the signaling disconnect configuration comprises disconnection of at least one of the remaining dice from said interface.

\* \* \* \* \*